(12) United States Patent
Hase (10) Patent No.: US 6,440,751 B1
(45) Date of Patent: Aug. 27, 2002

(54) METHOD OF MANUFACTURING THIN FILM AND THIN FILM CAPACITOR

(75) Inventor: Takashi Hase, Tokyo (JP)

(73) Assignee: NEC Corporation, Tokyo (JP)

( * ) Notice: Subject to any disclaimer, the term of this patent is extended or adjusted under 35 U.S.C. 154(b) by 34 days.

(21) Appl. No.: 09/653,141

(22) Filed: Aug. 31, 2000

(30) Foreign Application Priority Data

Aug. 31, 1999 (JP) ............................................. 11-245468

(51) Int. Cl.[7] .............................................. H01L 21/00
(52) U.S. Cl. ............................ 438/3; 438/608; 438/660
(58) Field of Search ............................ 438/3, 660, 782, 438/785, 608

(56) References Cited

U.S. PATENT DOCUMENTS 6,229,166 B1 * 5/2001 Kim et al. .................. 257/295

OTHER PUBLICATIONS

Suzuki et al. Japanese J. of Appl. Phys. 1996, vol. 35, pp. 4896–4899.*
"Low temperature perovskite formation of lead zirconate titanate thin films by a seeding process", by Chi Kong Swok, et al., J. Master Res., vol. 8, No. 2, Feb. 1993, pp. 339–344.
"Low Temperature Processing of Ferroelectric Pb(Zr0.53Ti0.47)O3 Thin Film from Molecular–Designed Alkoxide Precursor Solution", by Hisao Suzuki, et al., Japanese Journal of Appl. Phys., 1996, vol. 35, pp 4896–4899.

* cited by examiner

Primary Examiner—Caridad Everhart
(74) Attorney, Agent, or Firm—Scully, Scott, Murphy & Presser (57) ABSTRACT

In a method of manufacturing a thin film, a buffer layer is formed a substrate. Thereafter, a ferroelectric thin film material is applied thereto before thermally decomposing the buffer layer. Subsequently, the buffer layer and the ferroelectric thin film are decomposed together. Finally, a crystallized thermal process is performed.

20 Claims, 7 Drawing Sheets

METHOD OF MANUFACTURING THIN FILM AND THIN FILM CAPACITOR

BACKGROUND OF THE INVENTION

This invention relates to a method of manufacturing a crystallized thin film formed by ferroelectric substance, such as Pb (Zr, Ti) $O_3$ (PZT) by the use of a sol-gel method.

When a ferroelectric thin film is used as a capacitor insulating film of a non-volatile memory, it is indispensable to reduce an area of a memory cell in order to improve the integration of the memory.

To this end, it is necessary to directly form the ferroelectric thin film capacitor on a conductive plug which is recently applied to a DRAM (Dynamic Random Access Memory) having high integration.

In this event, when a thermal treatment is performed during a production of the ferroelectric thin film capacitor, the conductive plug and a diffusion barrier layer attached thereto (for example, TiN/Ti) are oxidized. Consequently, the conductivity is often and inevitably lost.

Therefore, it is required that a temperature during the production of the ferroelectric thin film is reduced to 500° C. or less, more preferably 450° C. or less, to avoid such oxidation.

Meanwhile, it is well known that Pb base ferroelectric substance, in particular, Pb (Zr, Ti) $O_3$ (hereinafter, abbreviated as PZT) and material added slight of additive such as La and Nb into PZT is suitable as ferroelectric thin film material for the non-volatile memory. This is because the Pb base ferroelectric substance has a large residual polarization, and can be produced at about 600° C.

As the production method of the ferroelectric thin film, the sol-gel method is desirable because it has such advantage that an excellent thin film can be obtained with superior repeatability using a cheaper equipment. In such a sol-gel method, an organic metal material is dissolved into desired solvent, and is applied and baked.

For example, it has been reported that PZT of Zr/Ti=53/47 becomes a single perovskite phase by using a buffer layer of $PbTiO_3$ (hereinafter, abbreviated as PT) by the sol-gel method at 500° C. written in Journal of material research 1993, Vol. 8. Page 339 (C. K. K wok et al., J. Mater. Res. 8, 339 (1993)).

Figure 1:
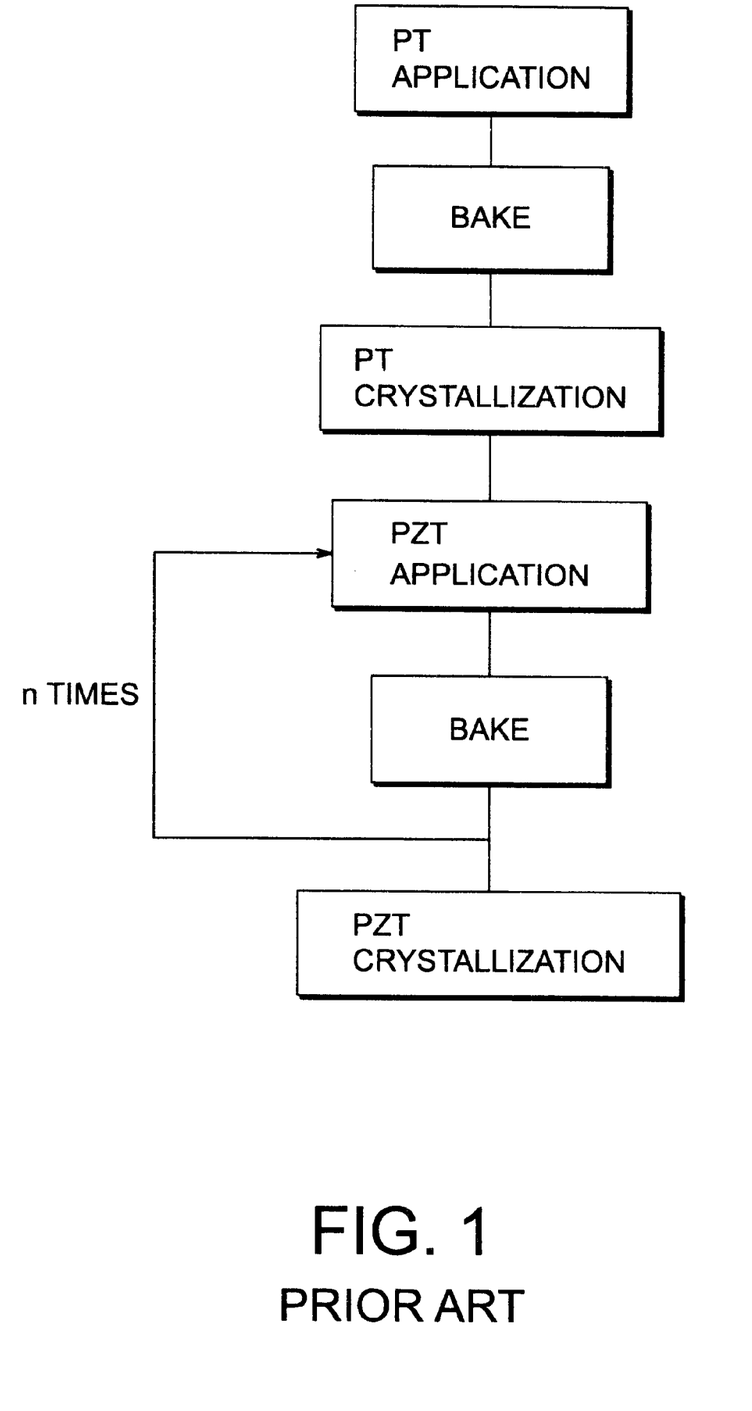
FIG. 1 is a flowchart showing a crystallized process of a PZT thin film according to a first conventional method.

In this case, the production process of the PZT thin film is illustrated in FIG. 1, and the PT layer is crystallized before applying PZT. In this paper, although a sapphire substrate is used, the electrical characteristic such as ferroelectric characteristic is not reported at all.

Further, disclosure has been made about such a fact that PZT is produced using a PT buffer layer by the sol-gel method at 450° C. in Japanese Journal of Appl. Phys, 1996, Vol. 35, page 4896 (H. Suzuki et al., Jpn. J. Appl. Phys. 35, 4896 (1996)).

Although the single perovskite phase is formed 450° C. ,as illustrated in FIG. 4 in this paper, the paper does not disclose or teach the ferroelectric characteristic.

Moreover, the dielectric constant is 30 or less at about 0.2 $\mu$m, as shown in FIG. 5 in this paper, and the characteristic is not enough to be practically used.

Figure 2:
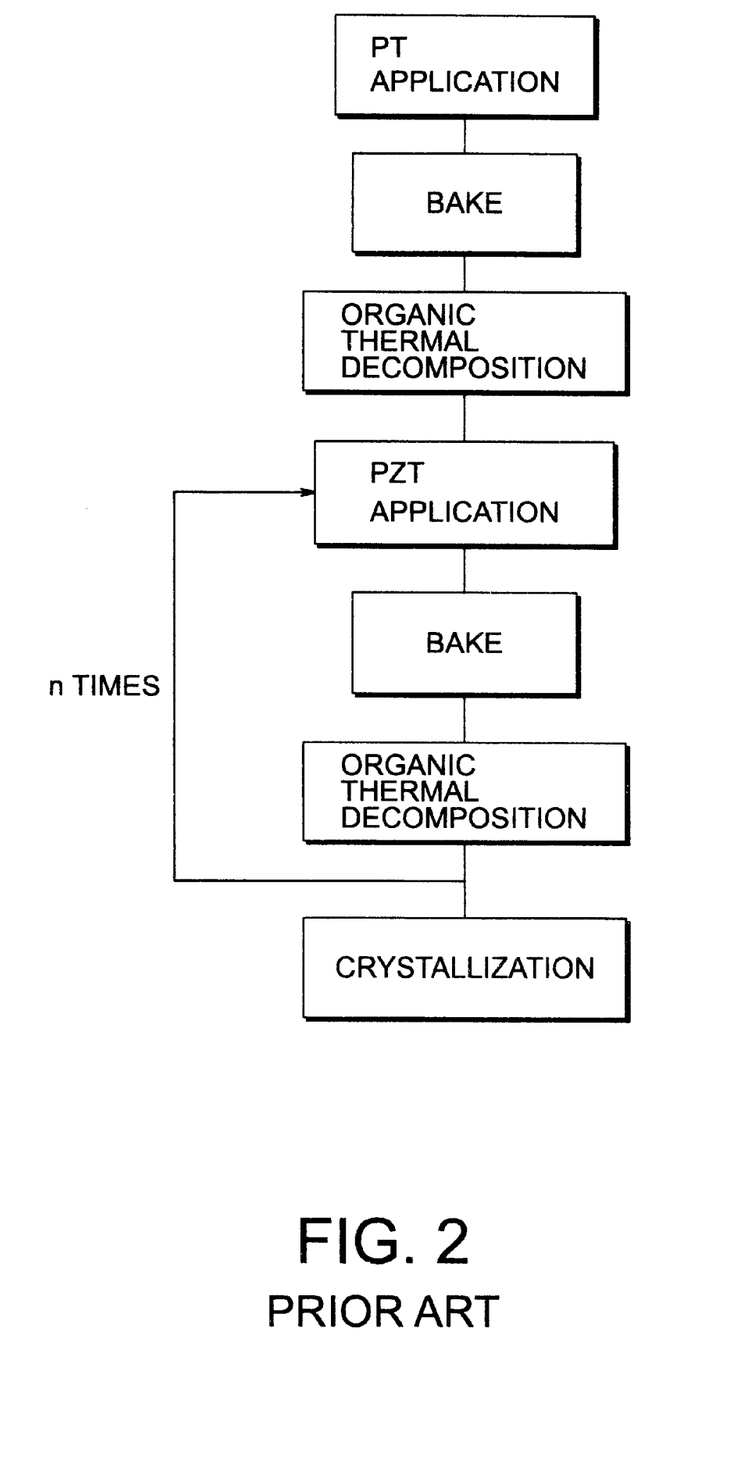
FIG. 2 is a flowchart showing a crystallized process of a PZT thin film according to a second conventional method.

The process for producing the PZT thin film disclosed in this paper is illustrated in FIG. 2, and the PT layer is decomposed by an organic thermal process at 350° C. before applying PZT.

As mentioned above, the Pb base ferroelectric substance, in particular, the PZT based ferroelectric thin film (the film thickness of 300 nm or less) having excellent composition at 500° C. or less, more desirably 450° C. or less has not been realized by the use of the sol-gel method

SUMMARY OF THE INVENTION

It is therefore an object of this invention to provide a method of manufacturing a thin film and a capacitor using excellent PZT base ferroelectric material at a low temperature by the use of the sol-gel method.

In a method of manufacturing a thin film according to this invention, a buffer layer is formed on a substrate. Thereafter, a ferroelectric thin film material is applied thereto before thermally decomposing the buffer layer.

Subsequently, the buffer layer and the ferroelectric thin film are decomposed together. Finally, a crystallized thermal process is performed.

In this event, the buffer layer is provided so as to proceed the crystallization of the thin film on the buffer layer, and may be referred to as a seed forming layer.

The deposition temperature due to the sol-gel method can be lowered by forming the thin film using such a method.

When this method is applied to the PZT thin film, a buffer layer containing $PbTiO_3$ as main component is formed on the substrate.

Thereafter, a thin film material containing PZT as main component is applied before decomposing the buffer layer by a thermal organic process.

After the buffer layer and the thin film are decomposed together by the thermal organic process, a crystallized thermal process is performed.

More specifically, after the buffer layer containing $PbTiO_3$ as main component is formed on the substrate, the buffer layer is baked at a temperature at which organic thermal decomposition does not occur.

Subsequently, a thin film material containing PZT as main component is applied on the buffer layer.

After the PZT thin film is baked at a temperature at which the organic thermal decomposition does not occur, the buffer layer and the thin film are decomposed together by the thermal organic process. Finally, the crystallized thermal process is performed.

In this case, the application step of the thin film containing PZT as main component through the crystallized thermal step may be repeated after the crystallized thermal process such that the PZT thin film has the preselected film thickness.

In this event, the duration of the final crystallized thermal process may be longer than that of the previous crystallization thermal process.

This reason will be explained hereinbelow. Namely, when the crystallization is carried out at such a low temperature, as thermal process duration is longer, the characteristic such as the ferroelectric characteristic is more improved.

If the crystallization thermal process is performed for long duration at every application layers, the final crystallization thermal process is unnecessary.

However, long duration is required to manufacture the thin film when the application number is particularly increased. In consequence, the throughput is degraded.

In the meantime, the layer, which is initially applied, is subjected to the thermal process having the longest duration. Consequently, the crystallized thermal process durations are variable for the respective application layers, and the thin film may be formed such that each application layer has not a uniform characteristic.

To this end, it is preferable that the final crystallization thermal process, which is entirely performed, is carried out for longer duration.

Further, in a method of manufacturing a PZT thin film according to this invention, a buffer layer containing $PbTiO_3$ as main component is formed on the substrate.

Thereafter, the buffer layer is baked at a temperature at which the organic thermal decomposition does not occur.

Subsequently, the thin film material containing PZT as main component is applied on the buffer layer.

After the PZT thin film is baked at a temperature at which the organic thermal decomposition does not occur, the buffer layer and the thin film are decomposed together by the thermal organic process. Finally, the crystallized thermal process is entirely performed.

In this case, the application step of the thin film containing PZT as main component through the thermal decomposition step may be repeated after the crystallized thermal process such that the PZT thin film has the preselected film thickness.

Further, RTA (Rapid Thermal Annealing) decomposition may be performed after decomposing by the organic thermal process.

Alternatively, the RTA decomposition may be carried out instead of the organic thermal decomposition.

The general organic thermal decomposition is carried out within the temperature range between 300° C. and 400° C. for process duration of about 10 minutes in the oxygen atmosphere (in oxygen gas or in $H_2O/O_2$ atmosphere).

However, the RTA decomposition is conducted at a slightly higher temperature although the process atmosphere is not changed.

Namely, the RTA is carried out within the temperature range between 430° C. and 450° C. during several seconds to several minutes, more specifically, for about 15 seconds to about 2 minutes.

In case that the crystallization is carried out after performing the PZT application for several times, carbon in the film is not sufficiently decomposed and may be remained in the film as impurity when the application is performed again after conducting only the general organic thermal decomposition.

Therefore, it is preferable to combine the RTA decomposition after the general organic thermal decomposition.

When the crystallization thermal process temperature exceeds 500° C. in the above-mentioned manufacturing method of the PZT thin film, the crystallization of the perovskite phase starts without the PT buffer layer, and the effect of the PT buffer layer is reduced. Therefore, the temperature range between about 430° C. and 450° C. is desirable.

The thermal process temperature is variable in dependence upon the composition ratio between Zr and Ti in PZT. As the ratio of Ti is higher, the perovskite phase is readily generated at the lower temperature.

As the crystallization thermal process temperature is lower, the pyrochlore phase, which does not represent the ferrroelectric characteristic, is more easily generated. This phenomenon is well known in the art.

However, it is possible to obtain the crystallized phase of the perovskite phase at the temperature of 430° C. or higher according to this invention.

Further, the baking process is prepared in addition to the crystallization or the organic thermal decomposition. The baking process is carried out to dry solvent, and can dry the thin film by performing the thermal process in the desired atmosphere without the organic thermal decomposing within the temperature range between about 100° C. and 250° C. for about 10 minutes although a slight change occurs in accordance with the kind of the solvent.

Moreover, this invention is applicable as a method of manufacturing a capacitor using the PZT thin film. In this case, an upper electrode may be formed after crystallizing the PZT thin film.

Preferably, it is possible to obtain the ferroelectric thin film superior in performance by crystallizing the PT thin film with the PZT thin film together after forming the upper portion electrode.

Further, it is preferable that the film thickness of the buffer layer containing $PbTiO_3$ as main component is thinner taking the performance of the obtained capacitor into account. However, it is permitted that the thickness is 10% or less of the film thickness of the layer containing PZT as main component.

Figure 3A:
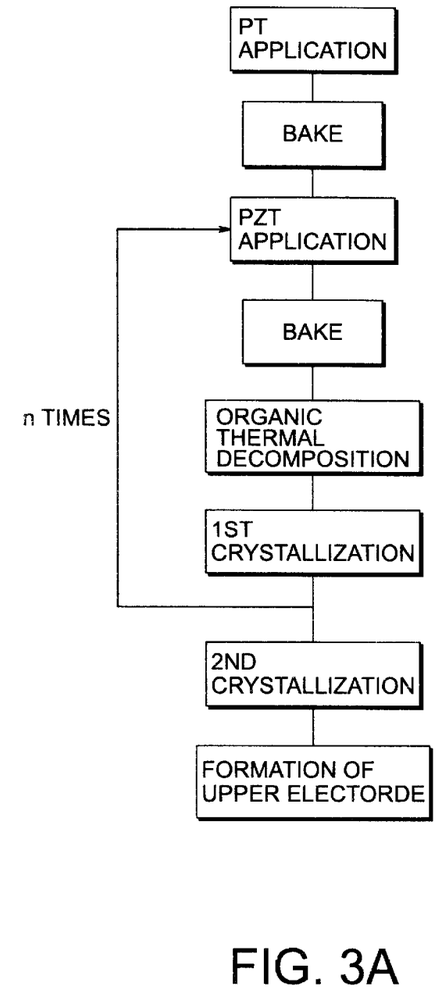
FIGS. 3A and 3B are flowcharts showing crystallized process of a PZT thin film according to this invention.

In FIG. 3A, the upper electrode is formed after crystallizing the PZT thin film.

Although the pervskite phase serving as the ferroelectric phase is crystallized at 450° C. or less in PT, PT itself is not suitable as the capacitor for the memory because anti-electric field is large and the repeating operation resistance is also small.

However, PT has such a characteristic that the crystallization is carried out at the lower temperature and the PT is similar with PZT in the crystal structure and the lattice constant.

With this characteristic, the energy for crystallizing PZT can be reduced by using it as the buffer layer during the deposition of PZT.

Such an effect results in the following mechanism. Namely, when the laminated PT layer and PZT layer in the non-crystallized state are subjected to the thermal process, the PT layer having small energy for crystallizing is first crystallized, and the PZT layer is successively crystallized.

Such continuous crystallization readily proceeds when the interface between the PT layer and the PZT layer has a certain degree of slope by mutual diffusion.

Therefore, the reduction effect of the PZT crystallization temperature of the PT buffer layer is most effectively obtained when a certain degree of mutual diffusion occurs at the interface between PZT and PT at the stage before crystallization of PZ, and PZT and PT in the non-crystallized state are crystallized together.

To obtain such a state, it is effective to apply the PZT layer before performing the organic thermal decomposition of the PT buffer layer and conducting the organic thermal decomposition for the both together in the sol-gel method. This is because the entire organic thermal deposition process causes the mutual diffusion of the interface of PZT/PT.

The continuous crystallization from the buffer layer side proceeds by performing the crystallized thermal process in this state, and the crystallization of PZT becomes possible at the low temperature between about 430° C. and 450° C.

Figure 3B:
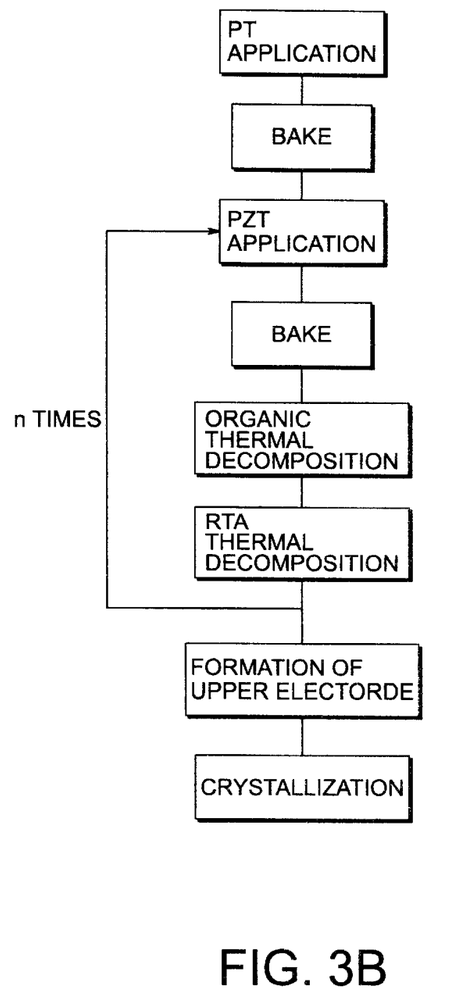

In FIG. 3B, the PT thin film and the PZT thin film are crystallized after forming the upper electrode. In this method, it is possible to improve the polarization switching characteristic of the ferroelectric thin film capacitor formed at the low temperature between about 430° C. and 450° C. at low electric field.

The upper electrode is formed before the crystallized thermal process. Thereby, the stress inside the PZT thin film generated during the crystallization is reduced by clamping the upper interface of the PZT thin film before the crystallization.

Further, defects generated at the interface is reduced by thermally processing the interface between PZT and the upper electrode at the same time as the PZT crystallization.

As a result, the polarization conversion characteristic of the PZT thin film capacitor formed under the low temperature can be improved at the low electric field.

DESCRIPTION OF PREFERRED EMBODIMENTS

FIRST EXAMPLE

Description will be made about a first example of this invention below.

A thermal oxide Si substrate, which was deposited with the PT thin film (a lower electrode), was used as the ferroelectrical deposition substrate.

The PT buffer layer was formed by mixing anhydride lead acetate (Pb (OCOCH$_3$)$_2$) with tetra-isopropoxy titanium (Ti (OC$_3$H$_7$)$_4$) such that Pb/Ti was equal to 1.15/1.00, and thereafter, dissolving into 1-methoxy-2-propanol ,and was applied with 2000 rpm by the use of a spin-coater using solution adjusted to 0.03 mol/Kg.

The PT buffer layer was baked at 250° C. for 10 minutes in the air.

Subsequently, the PT buffer layer was formed by mixing anhydride lead acetate (Pb (OCOCH$_3$)$_2$) with tetra-isopropoxy titanium (Ti (O-i-C$_3$H$_7$)$_4$), and tetra-tert-butoxy zirconium (Zr (O-t-C$_4$H$_9$)$_4$) such that Pb/Zr/Ti was equal to 1.15/0.45/0.65, and thereafter, dissolving into 1-methoxy-2-propanol, and was applied with 2000 rpm by the use of the spin-coater using solution adjusted to 0.4 mol/Kg onto the substrate in which the PT was applied.

After the PT buffer layer was baked at 250° C. for 10 minutes in the air, the organic thermal decomposition was carried out at 400° C. for 10 minutes in oxygen, and further, the first crystallization was performed at 450° C. for 10 minutes in oxygen.

The step from the PZT layer application to the first crystallization at 450° C. was once repeated. Finally, the second crystallization was carried out at 450° C. for 30 minutes in oxygen to obtain the PZT thin film (thereinafter, referred to as PZT-1) having the film thickness of 200 nm.

In the above-mentioned process, the PZT layer was applied and baked twice. The first layer PZT was crystallized by the first crystallization before the PZT application step of the second layer. The crystallized first layer PZT served to assist the crystallization of the second layer PZT.

Consequently, the PT layer was not always applied again before applying the second layer PZT layer. However, the PT layer might be applied in accordance with the ferroelectric characteristic of the obtained device as needed.

The PZT thin film (hereinafter, referred to as PZT-4) manufactured by the same process without applying the PT buffer layer had the film thickness of 185 nm. In consequence, the film thickness of the PT buffer layer was equal to about 15 nm.

In the process of PZT-1, the PZT thin film (hereinafter, referred to as PZT-2) and the PZT thin film (hereinafter, referred to as PZT-3) were simultaneously manufactured.

In this case, the PZT-2 was obtained by decomposing by the organic thermal process at 400° C. for 10 minutes in oxygen successively after baking the PT buffer layer at 250° C.

On the other hand, the PZT-3 was obtained by crystallizing at 450° C. for 10 minutes in oxygen successively after baking the PT buffer layer at 250° C.

The PZT-2 corresponded to a sample when the PT buffer layer was decomposed by the organic thermal process before applying the PZT layer. While, the PZT-3 corresponded to a sample when the PT buffer layer was crystallized before applying the PZT layer.

Figure 4:
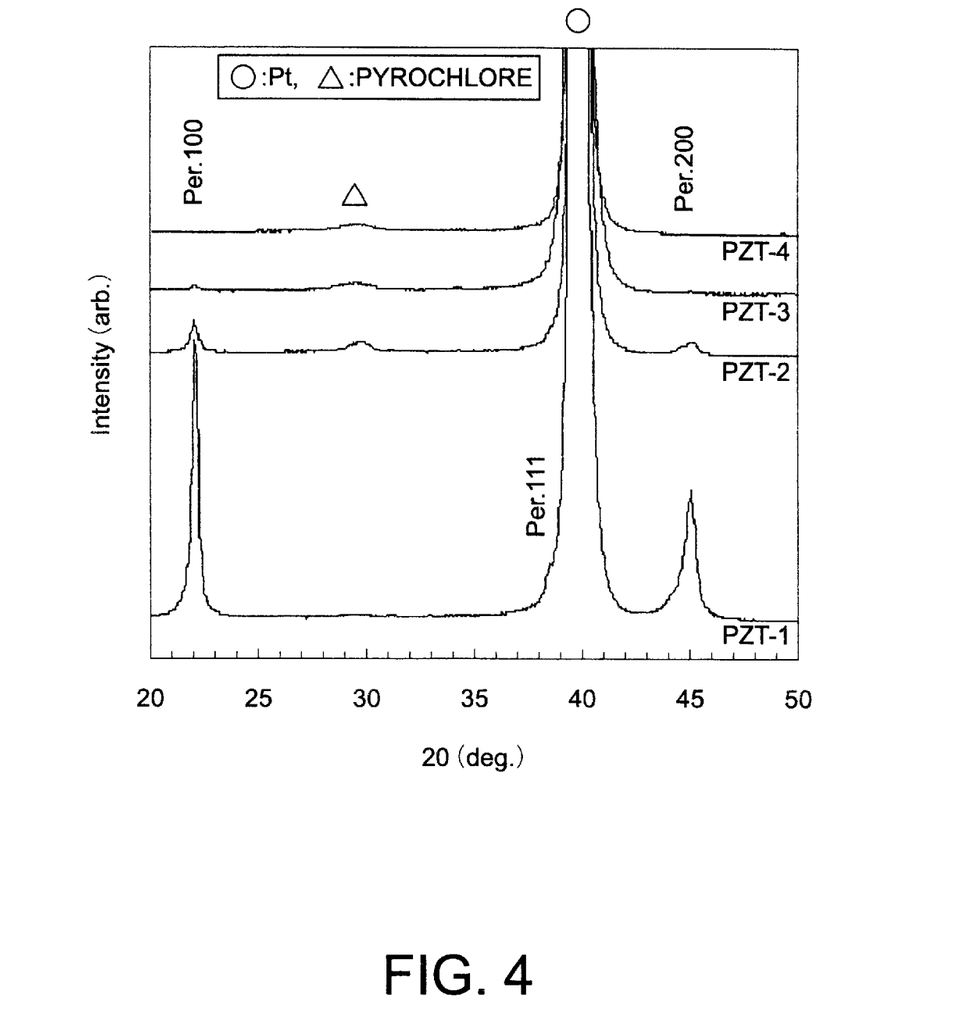
FIG. 4 is a diagram showing X-ray diffraction of PZT-1–4 according to a first example.

In this event, the X-ray diffraction of PZT-1–4 are illustrated in FIG. 4.

In the PZT thin film having no PT buffer layer, the pyrochlore phase of the normal dielectric phase appeared. By contrast, the perovskite phase was crystallized in the PZT thin film on the PT buffer layer.

It is apparent that the PT buffer layer had an effect for reducing the crystallized temperature of PZT on the PT buffer layer.

However, each of the PZT-2 and the PZT-3 had the low intensity of the perovskite phase and the mixed pyrochlore phase, and low crystallized degree of the perovskite phase in comparison with the PZT-1 in which the PT buffer layer and the PZT layer were decomposed together by the organic thermal process and were crystallized together.

When the surfaces of the PZT-1–4 were observed by the use of the electron microscope, perovskite crystal grains were closely generated within the range of about 0.1–0.3 $\mu$m.

By contrast, island-like perovskite crystal grains existed with low density in PZT-2 and PZT-3, and the remaining portion was buried with pyrochlore microcrystalline grains. In PZT-4, the perovskite crystal grains were not observed at all.

An Ir/IrO$_2$ upper portion electrode having a diameter of 300 $\mu$m was formed on the surface of PZT-1–3 by the use of the magnetron-sputtering method, and was annealed at 450° C. in oxygen.

Figure 5:
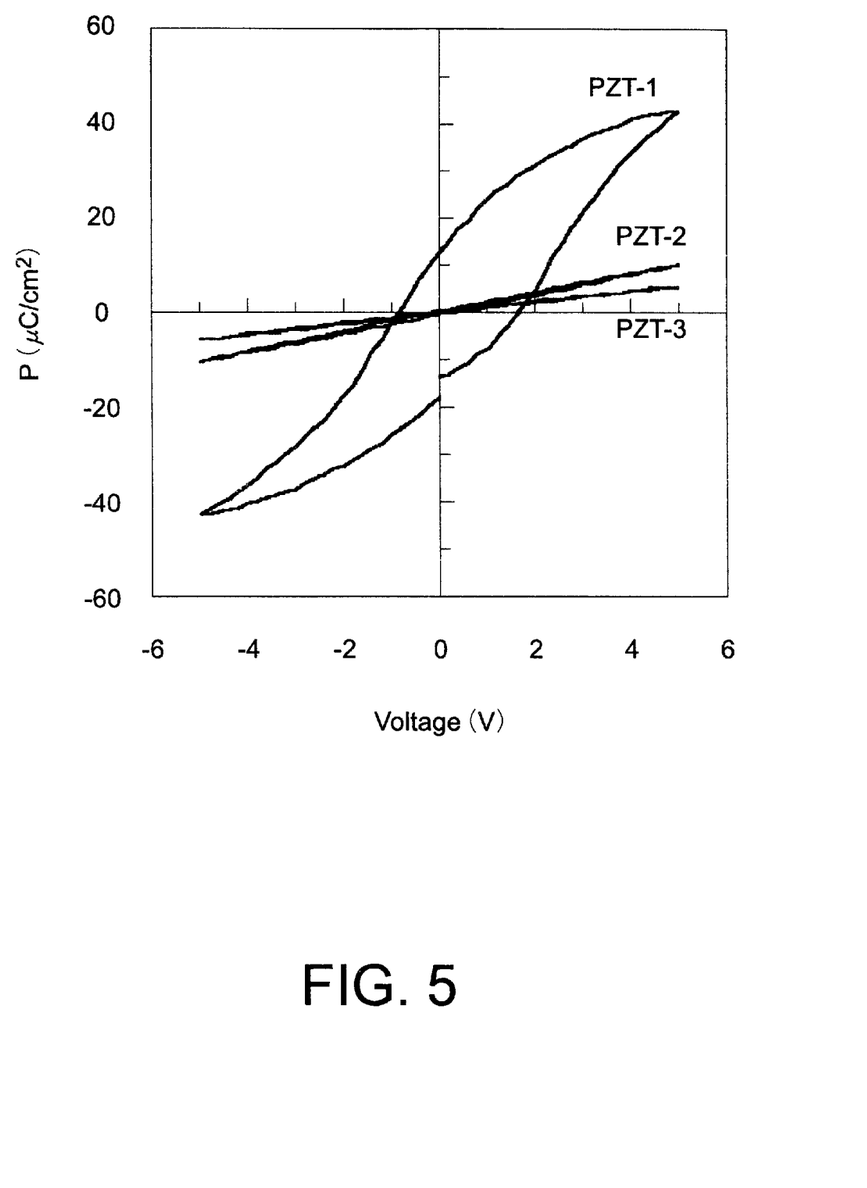
FIG. 5 is a diagram showing a hysteresis curve of PZT-1–3 when ±5V is applied according to a first example.

The hysteresis curve when ±5 V was applied is illustrated in FIG. 5.

PZT-1 represents the ferroelectric hysteresis, and the difference between the positive remanent polarization and the negative remanent polarization was 2Pr=30.5 $\mu$C/cm$^2$. In contrast, each of PZT-2 and PZT-3 did not represent the ferroelectric characteristic.

In this event, the polarization fatigue phenomenon due to the repetition due to the polarization reversal was measured by continuously applying bipolar pulses of ±5 V with respect to PZT-1, it was confirmed that the reduction of the remanent polarization was not observed until $10^8$ cycle.

From the above-mentioned results, it was apparent that it was effective to decompose by the organic thermal process and crystallize for the laminated PT buffer layer and PZT layer together when the PZT thin film was crystallized at 450° C.

Although the PZT layer was applied and baked twice in the first example, the application number could be suitably and freely changed in dependence upon the film thickness.

SECOND EXAMPLE

Description will be made about a second example of this invention below.

The PT layer was first applied on the substrate by the use of the spin coater with 2000 rpm using the same substrate, the solution for the PT buffer layer and the solution for the PZT layer, and was baked at 250° C. for 10 minutes in oxygen.

Subsequently, the same solution for the PZT layer as the first example was applied onto the substrate applied with the PT by the use of the spin coater with 2000 rpm.

After the solution was baked at 250° C. for 10 minutes in the air, the organic thermal decomposition was carried out at 400° C. for 10 minutes in oxygen ,and further, the rapid thermal anneal (RTA) was conducted at 450° C. for 30 seconds in oxygen.

The step from the PZT layer application to the RTA at 450° C. in oxygen was repeated once to obtain the PZT thin film having the film thickness of 200 nm. It was confirmed that the PZT layer was not crystallized to the perovskite phase in this stage.

The RTA process was carried out in order to perform complete organic thermal decomposition at a higher temperature than 400° C. by performing the oxygen process of 450° C. for a short duration without crystallizing PZT to the perovskite phase.

The Ir/IrO$_2$ upper electrode having the diameter of 300 µm was formed on the surface of the obtained PZT thin film by the use of the magnetron-sputtering method, and the crystallization thermal process was finally conducted at 450° C. for 30 minutes in oxygen to obtain a PZT thin film capacitor (hereinafter, referred to as PZT-5).

As a comparative example, after the crystallized thermal process was carried out at 450° C. for 30 minutes in oxygen before the formation of the upper electrode in the process of this example, the Ir/IrO$_2$ upper electrode was formed to obtain a PZT thin film capacitor (hereinafter, referred to as PZT-6).

Figure 6:
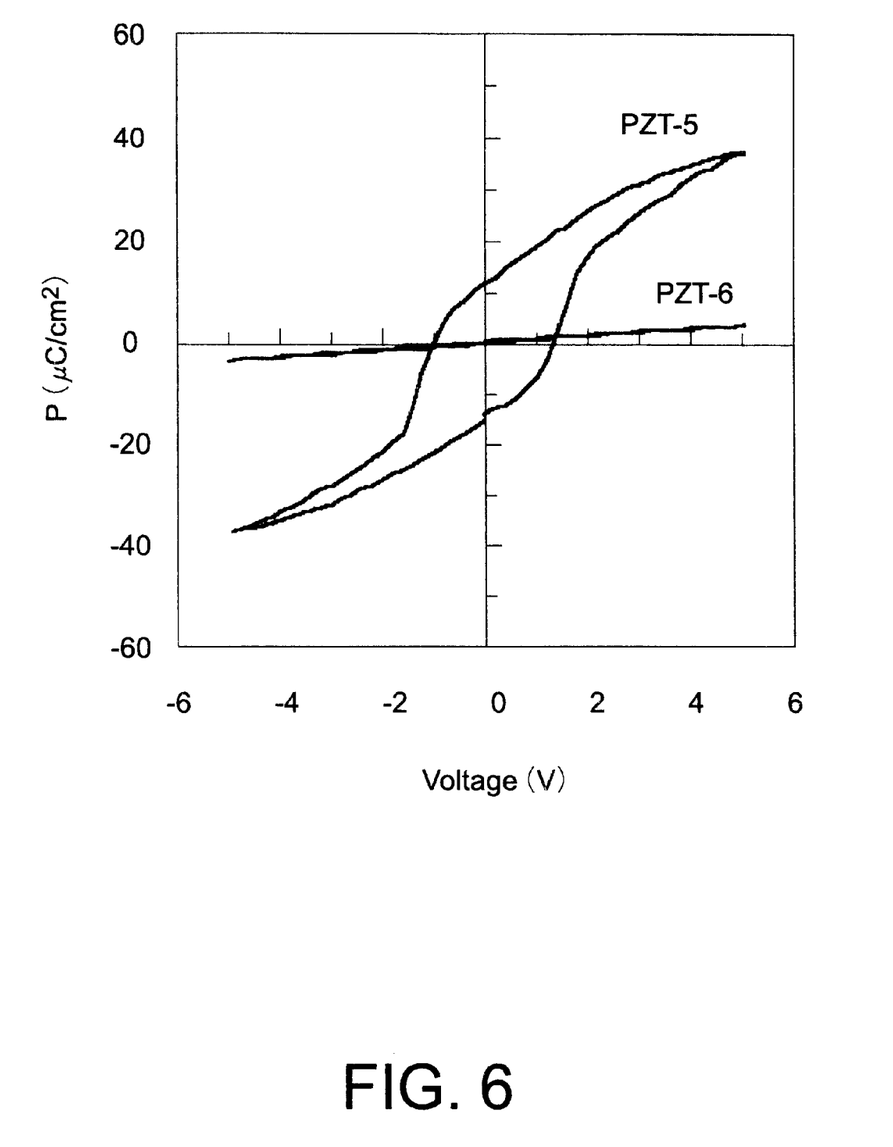
FIG. 6 is a diagram showing a hysteresis curve of PZT-5 an d PZT-6 when ±5V is applied according to a second example.

The hysteresis curves of PZT-5 and PZT-6 when ±5 V was applied are illustrated in FIG. 6.

PZT-6, in which the upper electrode was manufactured after the crystallization, did not have the ferroelectric ;characteristic. By contrast, PZT-5, which was crystallized after forming the upper electrode, represents rectangular excellent hysteresis characteristic, and 2Pr=26.8 $\mu C/cm^2$ was obtained.

Figure 7:
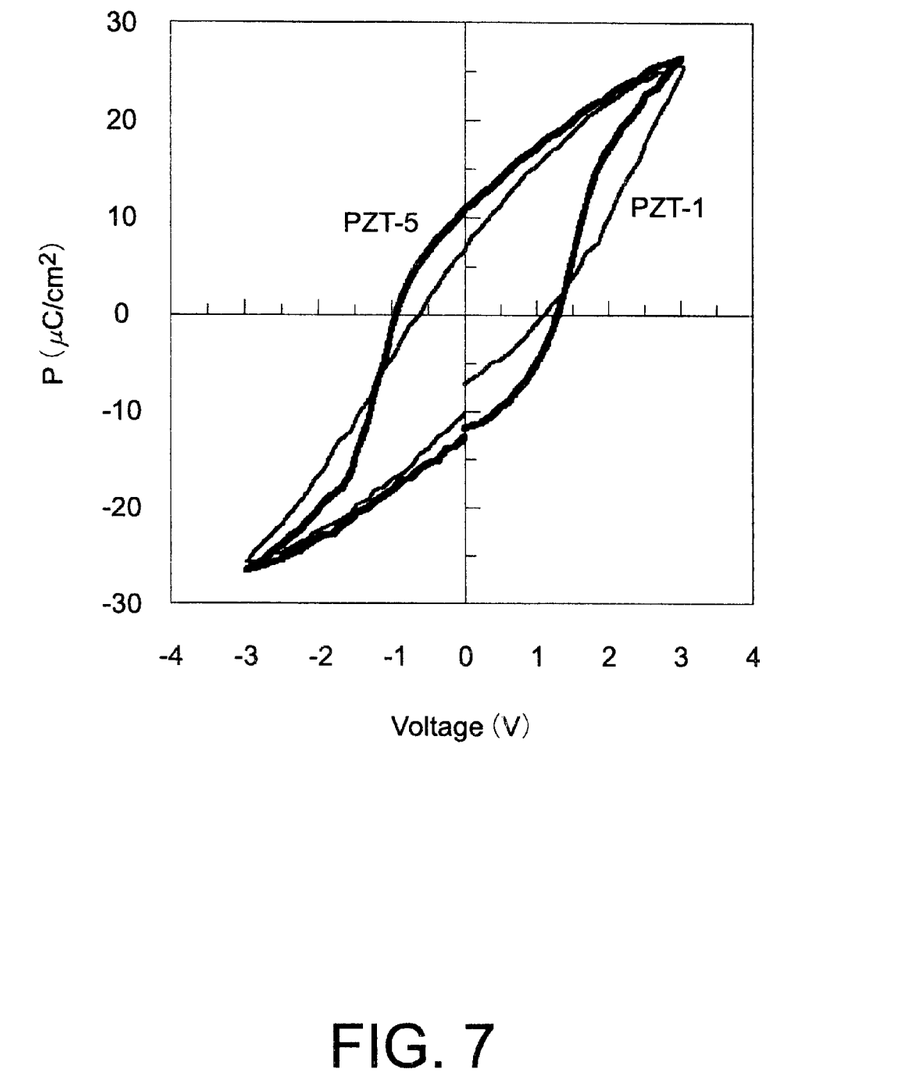
FIG. 7 is a diagram showing a hysteresis curve of PZT-1 and PZT-5 when ±3V is applied.

Further, the hysteresis curves of PZT-1 and PZT-5 when ±3 V was applied are illustrated in FIG. 7.

It was found out that PZT-5 had higher rectangular hysteresis characteristic, and was sufficiently saturated at 3V. Further, 2Pr of PZT-1 was equal to 16.8 $\mu C/cm^2$ at 3V while 2Pr of PZT-5 was equal to 23.7 $\mu C/cm^2$ at 3V, and PZT-5 had a higher remanent polarization value.

In this event, the polarization fatigue phenomenon due to the repetition due to the polarization reversal was measured by continuously applying bipolar pulses of ±5 V with respect to PZT-1, it was confirmed that the reduction of the remanent polarization was not observed until $10^8$ cycle.

From the above-mentioned results, it is apparent that the appearance of the ferroelectric characteristic is proceeded by performing the crystallized thermal process after forming the upper electrode before crystallizing to the perovskite phase of PZT when the PZT thin film is crystallized at 450° C.

Thereby, the PZT thin film capacitor, which is superior in the polarization conversion characteristic under low electric field, can be obtained.

In the above-mentioned embodiment, PZT of Zr/Ti=35/65 was used as the ferroelectric thin film while PT was used as the buffer layer.

When PZT different from Zr/Ti or PZT based donor additive, such as, La and Nb, or acceptor additive, or additive, such as, Ca and Sr for improving electric characteristic was added with about several mol % in composition as the ferroelectric thin film, the absolute value of the crystallized temperature was slightly changed. However, the effect of this invention was not changed.

Similarly, this invention is effective for the composition in which the same additive is added with about several mol % using PT serving as the buffer layer as the base.

When the thin film application is carried out several times, although the application is performed by the use of the same material, the material having different composition (for example, Zr/Ti ratio) or additive content may be used.

Further, this invention is not readily affected by the bottom electrode material because PZT is crystallized via the buffer layer.

Consequently, this invention is sufficiently effective for the bottom electrode material other than PT, such as, Ir, IrO$_2$, Ru and RuO$_2$, and the other conductive oxide electrode.

As the upper electrode, when the crystallization is particularly conducted after forming the upper electrode, the materials, such as Ir, IrO$_2$, Ru, and RuO$_2$, which can keep the conductivity in the oxide atmosphere, can be used.

However, the material is particularly restricted in the invention, and the other conductive oxide electrode may be used.

As mentioned above, the thin film, which has large remanent polarization at the low temperature and small polarization fatigue, can be obtained by using the sol-gel method in which the excellent thin film can be obtained with good repeatability using the cheaper equipment according to this invention.

Further, the capacitor, which superior in the polarization switching characteristic in the low electric field, can be also obtained.

In particular, according to this invention, the PZT thin film can be formed by the sol-gel method at the low temperature of about 430° C. which is impossible in the conventional method.

In consequence, the conductivity is not lost or eliminated by the oxidation of the conductive plug or the diffusion barrier layer. As a result, the device having high reliability can be realized.

While this invention has so far been disclosed in conjunction with several embodiments or examples thereof, it will be readily possible for those skilled in the art to put this invention into in various other manners.

What is claimed is:

1. A method of manufacturing a thin film on a substrate, comprising the following sequential steps of:
   forming a buffer layer on the substrate;
   applying a ferrocelectric thin film material before performing a first thermal decomposition of the buffer layer;
   performing said first thermal decomposition of the buffer layer and the ferroelectric thin film together; and
   performing a crystallization thermal process.

2. A method of manufacturing a PZT thin film on a substrate, comprising the following sequential steps of:
   forming a buffer layer containing $PbTiO_3$ as main component on the substrate;
   applying a thin film material containing PZT as main component before performing a first organic thermal decomposition of the buffer layer; and
   performing said first organic thermal decomposition of the buffer layer and the thin film together; and
   performing a crystallization thermal process.

3. A method of manufacturing a PZT thin film on a substrate comprising the following sequential steps of:
   forming a buffer layer containing $PbTiO_3$ as main component on the substrate;
   baking the buffer layer at a temperature at which organic thermal decomposition does not occur;
   applying a thin film material containing PZT as main component on the buffer layer;
   baking the PZT thin film at a temperature at which the organic thermal decomposition does not occur;
   performing a first organic thermal decomposition of the buffer layer and the thin film together; and
   performing a crystallization thermal process.

4. A method as claimed in claim 3, further comprising the steps of:
   applying the thin film material again after performing the crystallization thermal process;
   baking the PZT layer at a temperature at which the organic thermal decomposition does not occur; and
   performing the crystallization thermal process after performing said organic thermal decomposition of the buffer layer,
   wherein these steps being repeated such that the PZT thin film has the preselected film thickness.

5. A method as claimed in claim 4, wherein:
   the crystallization thermal process after the PZT thin film has a preselected thickness is carried out during a first duration, and
   the crystallization thermal process is previously carried out during a second duration,
   the first duration being longer the second duration.

6. A method as claimed in claim 3, further comprising the following step of:
   performing a RTA thermal decomposition after performing said organic thermal decomposition of the buffer layer.

7. A method as claimed in claim 3, wherein:
   a RTA thermal decomposition is carried out instead of the organic thermal decomposition.

8. A method as claimed in any one of claims 3, 6 or 7 further comprising the steps of:
   applying the thin film material again after performing the crystallization thermal process;
   baking the PZT thin film at a temperature at which the organic thermal decomposition does not occur;
   repeating the organic thermal decomposition such that the PZT thin film has the preselected film thickness; and
   performing the crystallization thermal process.

9. A method as claim in any one of claims 2 to 8, wherein:
   the crystallization thermal process is carried out within the range between 430° C. and 500° C.

10. A method of manufacturing a thin film capacitor on a bottom electrode, comprising the following sequential steps of:
    forming a buffer layer on the bottom portion electrode;
    applying a ferroelectric thin film material before performing a first thermal decomposition of the buffer layer;
    performing said first thermal decomposition of the buffer layer and the ferroelectric thin film together; and
    performing a crystallization thermal process.

11. A method of manufacturing a PZT thin film capacitor on a bottom electrode, comprising the following sequential steps of:
    forming a buffer layer containing $PbTiO_3$ as main component on the bottom electrode;
    applying a thin film material containing PZT as main component before performing a first organic thermal decomposition of the buffer layer; and
    performing a said first organic thermal decomposition of the buffer layer and the thin film together; and
    performing a crystallization thermal process.

12. A method of manufacturing a PZT thin film capacitor on a bottom electrode, comprising the following sequential steps of:
    forming a buffer layer containing $PbTiO_3$ as main component on the bottom electrode;
    baking the buffer at a temperature at which organic thermal decomposition does not occur;
    applying a thin film material containing PZT as main component on the buffer layer;
    baking the PZT thin film at a temperature at which the organic thermal decomposition does not occur;
    performing a first organic thermal decomposition of the buffer layer and the thin film together;
    performing a crystallization thermal process; and
    forming an upper electrode.

13. A method as claimed in claim 12, further comprising the steps of:
    applying the thin film material again after performing the crystallization thermal process;
    baking the PZT layer at a temperature at which the organic thermal decomposition does not occur; and
    performing the crystallization thermal process after performing said organic thermal decomposition of the buffer layer,
    these steps being repeated such that the PZT thin film has the preselected film thickness.

14. A method as claimed in claim 13, wherein:
    the crystallization thermal process after the PZT thin film has the preselected thickness is carried out during a first duration, and
    the crystallization thermal process is previously carried out during a second duration,
    the first duration being longer the second duration.

15. A method of manufacturing a PZT thin film capacitor on a bottom electrode, comprising the following sequential steps of:

forming a buffer layer containing PbTiO$_3$ as main component on the bottom electrode;

baking the buffer layer at a temperature at which a first organic thermal decomposition does not occur;

applying a thin film material containing PZT as main component on the buffer layer;

baking the PZT thin film at a temperature at which said organic thermal decomposition does not occur;

performing said first organic thermal decomposition of the buffer layer and the thin film together; and entirely performing a crystallization thermal process.

16. A method as claimed in claim 15, further comprising the following steps of:

performing a RTA thermal decomposition after performing said organic thermal decomposition of the buffer layer.

17. A method as claimed in claim 15, wherein:

a RTA thermal decomposition is carried out instead of the organic thermal decomposition.

18. A method as claimed in any one of claim 15 to 17, further comprising the steps of:

applying the thin film material again after performing the crystallization thermal process;

baking the buffer layer at a temperature at which the organic thermal decomposition does not occur;

repeating the organic thermal decomposition such that the PZT thin film has the preselected film thickness; and performing the crystallization thermal process.

19. A method as claimed in any one of claims 15 to 18, further comprising the following steps of:

forming the upper electrode before the crystallization thermal process.

20. A method as in any one of claims 10 to 19, wherein:

the crystallization thermal process is carried out within the range between 430° C. and 500° C.

* * * * *